(12) United States Patent
Fan

(10) Patent No.: US 7,938,648 B2
(45) Date of Patent: May 10, 2011

(54) BOARD MOUNTED ELECTRICAL CONNECTOR WITH REINFORCING DEVICE

(75) Inventor: Chia-Wei Fan, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/610,395

(22) Filed: Nov. 2, 2009

(65) Prior Publication Data

US 2010/0112827 A1 May 6, 2010

(30) Foreign Application Priority Data

Nov. 3, 2008 (TW) .............................. 97219595 U

(51) Int. Cl.
*H01R 12/00* (2006.01)
(52) U.S. Cl. ............................ 439/70; 439/331; 439/571
(58) Field of Classification Search .................... 439/70, 439/331, 71, 572, 571
See application file for complete search history.

(56) References Cited

U.S. PATENT DOCUMENTS

| | | | | |
|---|---|---|---|---|
| 5,833,472 A | * | 11/1998 | Bright | 439/70 |
| 7,602,201 B2 | * | 10/2009 | Ysaguirre et al. | 324/756.02 |
| 7,637,752 B2 | * | 12/2009 | Hsieh et al. | 439/70 |
| 2006/0079104 A1 | * | 4/2006 | Lai | 439/71 |
| 2007/0004242 A1 | * | 1/2007 | Pandey et al. | 439/70 |
| 2008/0081489 A1 | * | 4/2008 | MacGregor et al. | 439/71 |

* cited by examiner

*Primary Examiner* — Hien Vu
(74) *Attorney, Agent, or Firm* — Andrew C. Cheng; Wei Te Chung; Ming Chieh Chang

(57) ABSTRACT

The electrical connector (50) includes an insulative housing (51) defining a mounting face (501) for mounting onto a printed circuit board (10) and a mating face (502) opposite to the mounting face, a plurality of contacts (52) received in the insulative housing, an insulator (20) mounted to an underside of the printed circuit board, a back panel (30) attached to the insulator, and a plurality of fastening elements (40) mechanically interconnecting the back panel, the insulator and the insulative housing onto opposite sides of the printed circuit board. The insulator has a plurality of pairs of guiding posts (23) extending oppositely towards the back panel and the printed circuit board. The back panel defines a plurality of guiding holes (33) aligned with holes (14) on the printed circuit board for receiving corresponding guiding posts.

6 Claims, 3 Drawing Sheets

FIG. 2

BOARD MOUNTED ELECTRICAL CONNECTOR WITH REINFORCING DEVICE

CROSS-REFERENCE TO RELATED APPLICATION

This application is related to a co-pending U.S. patent application Ser. No. 12/380,870, filed on Mar. 3, 2009, and entitled "SOCKET ASSEMBLY WITH BACKPLANE", which has the same assignee with the present invention.

BACKGROUND OF THE INVENTION

1. Field of the Invention

The present invention generally relates to an electrical connector which connects an electronic module to a printed circuit board, and more particularly to an electrical connector with a reinforcing device for sandwiching the printed circuit board therebetween.

2. Description of Related Art

Present computer usually has a high speed and double data transmission rate and continually works for a long time. As a result, a powerful CPU (Central Processing Unit) of the computer brings up more and more heat. Therefore a heat sink is required to dissipate the heat during a normal work of the computer. When such a heat sink including a plurality of metal fins is mounted on top of a socket, which is mounted on a PCB and adapted to electrically interconnect the CPU and the PCB, the PCB easily subjects to invalidation. Since the PCB can not endure so heavy weigh, a back panel is employed to be assembled on a bottom surface of the PCB to strengthen the PCB. In the existing application, the heat sink is locked to a so called retention module (RM) which is bolted onto the PCB. In addition, the socket assembly includes a stiffener which is bolted to a reinforcing back panel disposed on the underside of the PCB. In order to effectively dissipate heats from the CPU, the heat sink must press hardly against to a top surface of the CPU. Inevitably, the spring load will also are transferred to the CPU and the socket on which the CPU is mounted. As a result, the back panel mentioned plays a vital role in this application.

Commonly, typical back panels include two types, one is configured by plastic, another is formed by metal. The plastic back panel has a simple manufacture process and can be manufactured with a lower cost, but it can not provide a sufficient rigidity to support the socket assembly. The metal back panel has a high rigidity and can well properly support the PCB. However, the metal back panel must be insulated from the PCB to prevent short circuiting conductive traces of the PCB. An improved design is to dispose a soft insulative film on a metal plane over a surface facing the PCB. The soft insulative film is attached to the metal plane by agglutinant to be integral back panel, then a plurality of screws are used to assemble the socket, the PCB, the soft insulative sheet and the metal plane to assemble them together.

Each of the soft insulative film and the metal plane defines a plurality of mounting holes for the screw passing there through. However, since the soft insulative sheet agglutinates to the metal plane, crimple airs and bladders may occur over the surface of the back panel, and it may takes time to align the mounting holes of the soft insulative sheet with that of the metal back panel. Furthermore, it is also not an easy thing to accurately position the insulative sheet together with the metal plane to the PCB for there is no positioning member between the insulative sheet and the PCB.

Hence, it is required to improve the disadvantages of the above sockets.

BRIEF SUMMARY OF THE INVENTION

An electrical connector in accordance with the present invention is structured for connecting an electronic module, such as a CPU, with a printed circuit board. The electrical connector comprises an insulative housing defining a mounting face for mounting onto the printed circuit board and a mating face opposite to the mounting face, a plurality of contacts received in the insulative housing, an insulator mounted to an underside of the printed circuit board, a back panel attached to the insulator, and a plurality of fastening elements. Each contact received in the insulative housing extends from the mounting face to the mating face. The insulator has a plurality of pairs of guiding posts protruding from opposite sides thereof and extending oppositely towards the back panel and the printed circuit board. The back panel defines a plurality of holes for receiving corresponding guiding posts. The fastening elements are mechanically interconnecting the back panel, the insulator and the insulative housing onto opposite sides of the printed circuit board after the guiding posts are retained in the back panel and the printed circuit board.

DETAILED DESCRIPTION OF THE INVENTION

Figure 1:
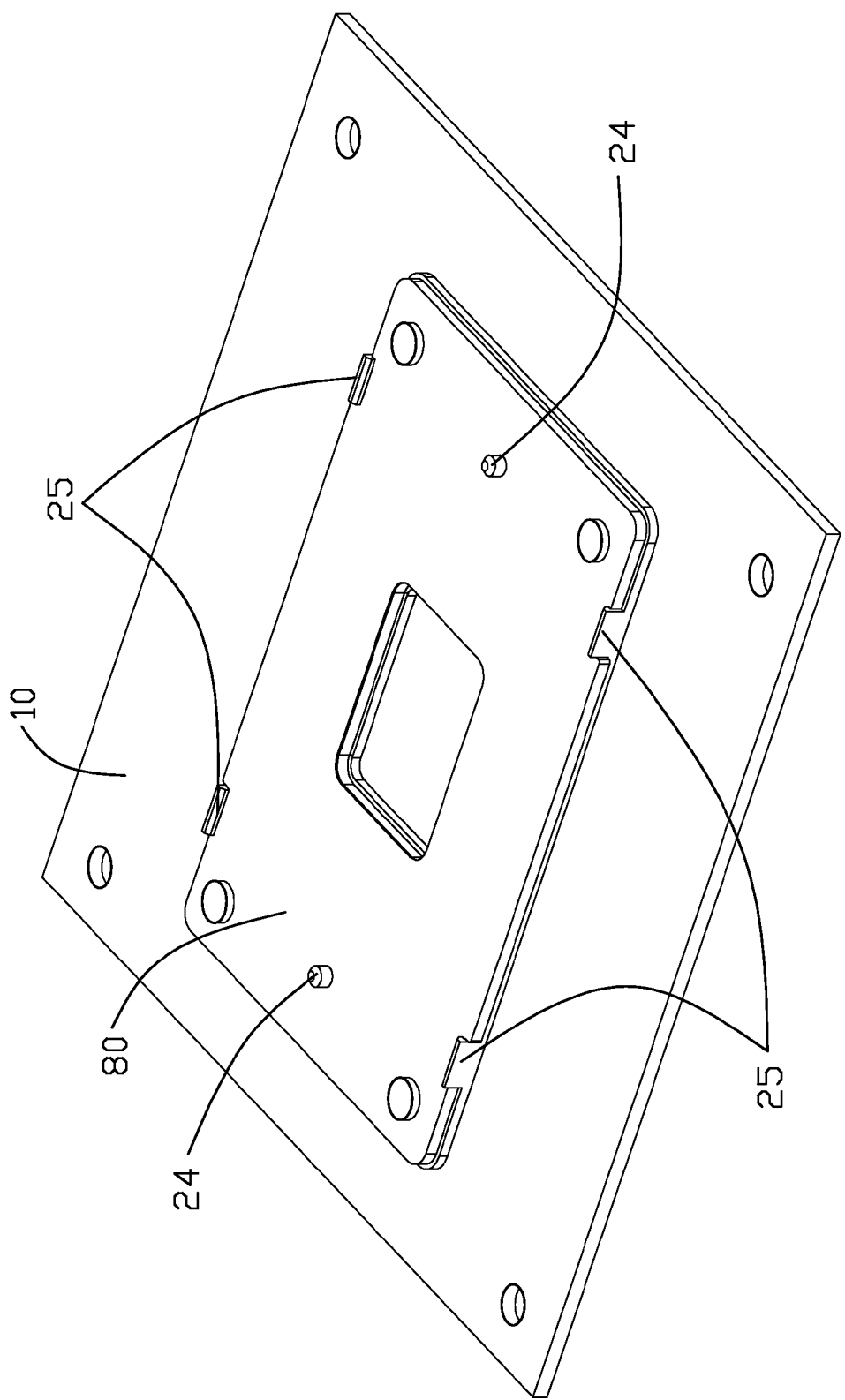
FIG. 1 is an assembled perspective view of a reinforcing device in accordance with the present invention mounted on a printed circuit board.

Reference will now be made to the drawing figures to describe the present invention in detail.

Figure 2:
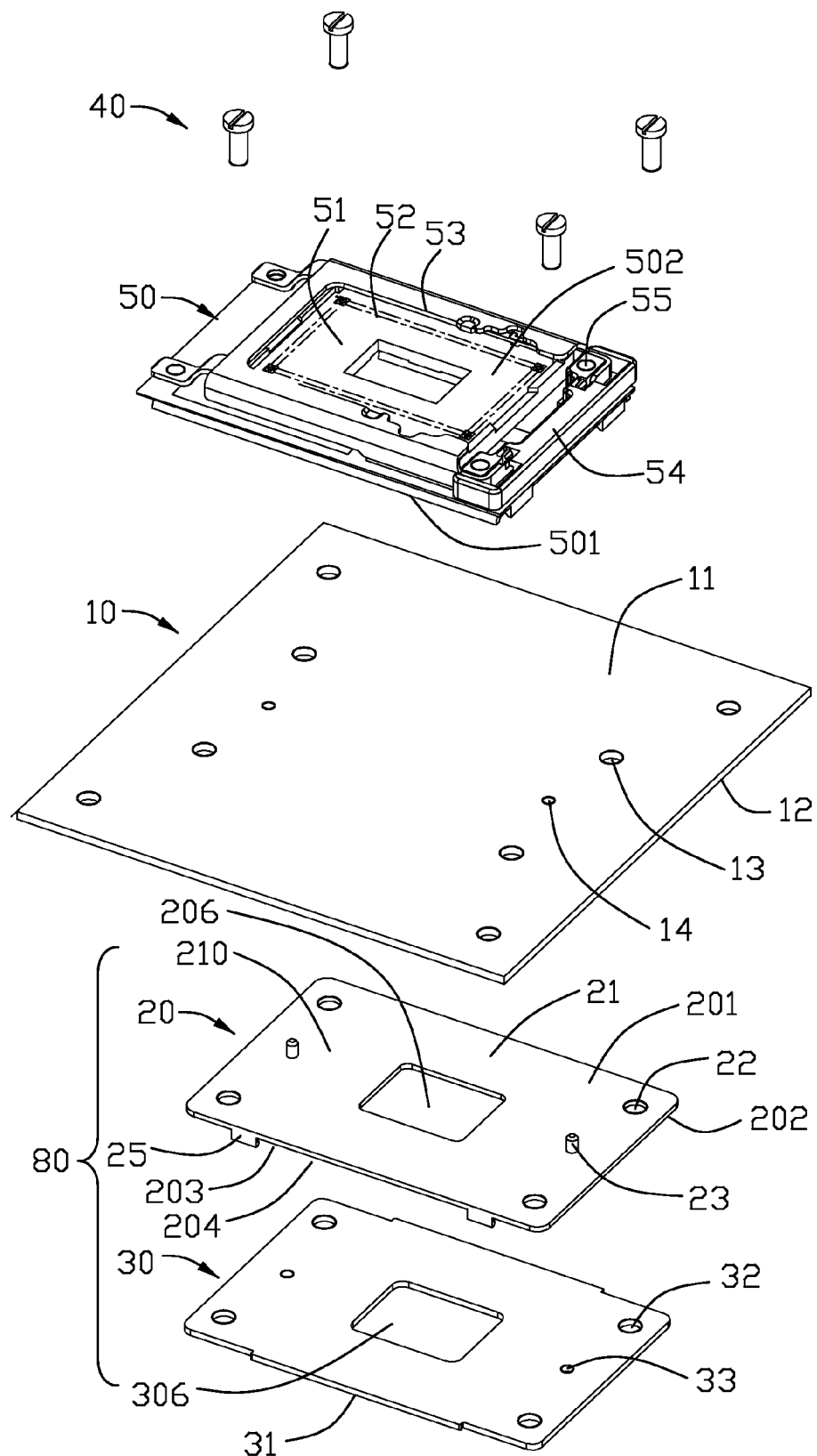
FIG. 2 is an exploded perspective view of an electrical connecter and the reinforcing device.

Referring to FIGS. 1 and 2, the electrical connector 50 with a reinforcing device 80 in accordance with the present invention is mounted on a printed circuit board 10. In the preferred embodiment, the electrical connector 50 is used to connecting an IC package (not shown), such as a CPU, with the printed circuit board 10. The electrical connector 50 comprises an insulative housing 51, a plurality of contacts 52 received in the housing 51, a metallic cover 53 assembled with the housing 51 and the reinforcing device 80 mechanically interconnected with the housing 51 by a plurality of screws 40. The reinforcing device 80 and the housing 51 are attached to opposite sides of the printed circuit board 10.

The insulative housing 50 has a mounting face 501 for mounting onto an upper surface of the printed circuit board 10 and a mating face 502 for receiving the CPU. Each contact 52 received in the housing 50 extends from the mounting face 501 to the mating face 502 to thereby electrically connect the CPU and the printed circuit board 10.

The reinforce device 80 comprises an insulator 20 mounting to an underside or a lower surface of the printed circuit board 10, and a back panel 30 assembled with the insulator 20, between which the printed circuit board 10 is sandwiched. In this preferred embodiment, both the insulator 20 and the back panel 30 are formed in planar, board-shape, and the back panel 30 is formed from a piece of metal sheet to provide excellent reinforcing force to the connector 50.

The rectangular, metallic, back panel 30 defines two pairs of through holes 32 at opposite side edges thereof for receiving the fastening elements, such as the screws 40. A guiding hole 33 is defined between each pair of through holes 32. In the preferred embodiment, the metallic back panel 30 forms two opposite long edges and two opposite short edges. The guiding hole 33 and corresponding pair of through holes 32 are positioned adjacent to the short edge. Each long edge of the back panel 30 has an elongated protrusion 31 protruding therefrom.

The insulator 20 has a similar structure with the metallic back panel 30, which also has two opposite longer side edges and two opposite shorter side edges. Two pairs of through holes 22 are defined adjacent to the shorter side edges. A pair of guiding posts 23, 24 are respectively formed on a first surface 201 and a second surface 202 of the insulator 20. The first surface 201 engages to the underside of the printed circuit board 10 and the second surface 202 engages to the metallic back panel 30. In the preferred embodiment, the pair of guiding posts 23, 24 extends along a same line. The insulator 20 provides a plurality of latches 25 around the periphery thereof and defines a receiving space 203 thereon. The latches 25 are formed to grasp the metallic back panel 30 when the metallic back panel 30 is received in the receiving space 203.

Figure 3:
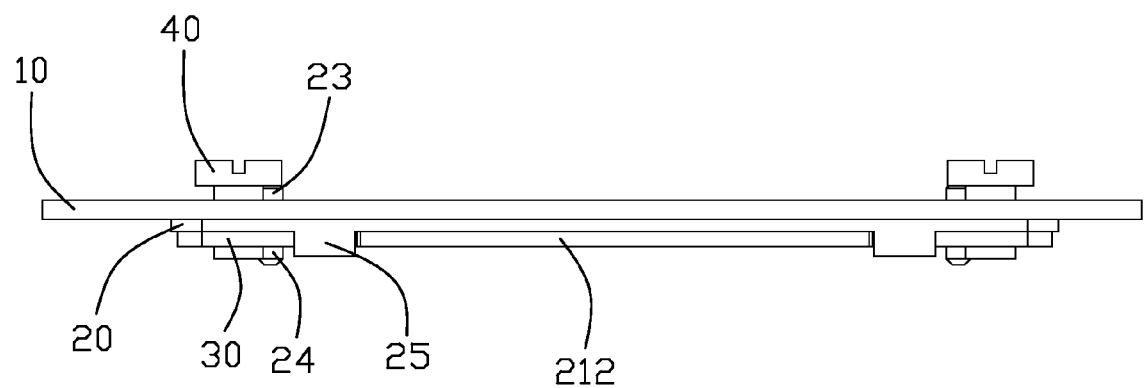
FIG. 3 is side view showing the reinforcing device mounted onto the printed circuit board without the electrical connector assembled thereon.

Referring to FIG. 3, the pair of guiding posts 23, 24 is positioned between an adjacent through hole 22, 32 and an adjacent latch 25 along a lengthwise direction of the insulator 20. An opening 204 is defined between the two latches 25 at the same side for engaging with the elongated protrusion 31 of the metallic back panel 30. In order to provide more flexibilities of the insulator 20 and the back panel 30, a central opening 206, 306 is respectively defined.

The printed circuit board 10 is sandwiched between the connector 50 and the reinforcing device 80, which are assembled thereto from opposite sides thereof. In application, the housing 51 with the contacts 52 retained thereon and the cover 53 assembled thereto is mounted to the upper surface of the printed circuit board 10. The through holes 22, 32, 13 of the insulator 20, the back panel 30 and the printed circuit board are aligned with each other after the pair of guiding posts 23, 24 extends and retained in corresponding guiding holes 33, 14 of the back panel 30 and the printed circuit board 10. Finally, the fastening elements 40 mechanically interconnect the connector 50 and the reinforcing device 80 on the printed circuit board 10. In other embodiment, the fastening elements could be any of other types which are known to the person having ordinary skilled in the art. In this embodiment, the fastening elements 40 are screws which insert through the through holes of the connector 50, the reinforce device 80 and the printed circuit board, respectively, and lock them together.

Each pair of guiding posts 23, 24 extending from opposite sides of the insulator 20 are employed to facilitate alignment of the through holes 13, 32 of the printed circuit board 10 and the back panel 30 so that the screws can be easily inserted into the corresponding through holes. It is convenience for the user to assemble the reinforcing device onto the printed circuit board.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector mounted on a printed circuit board having through holes thereof, comprising:
   an insulative housing defining a mounting face for mounting onto the printed circuit board and a mating face opposite to the mounting face;
   a plurality of contacts received in the insulative housing and extending from the mounting face to the mating face;
   an insulator mounted to an underside of the printed circuit board and forming a plurality of pairs of guiding posts extending from opposite sides thereof;
   a metallic back panel attached to the insulator and defining a plurality of holes to receive corresponding guiding post of the insulator; and
   a plurality of fastening elements mechanically interconnecting said back panel, said insulator and said insulative housing onto opposite sides of the printed circuit board after said pairs of guiding posts of the insulator are retained to the metallic back panel and the printed circuit board;
   wherein the insulator forms a plurality of latches around a periphery thereof to securely grip the metallic back panel and to be sandwiched between the printed circuit board and the metallic back panel;
   wherein the insulator and the metallic back panel define a plurality of through holes for insertion of the fastening elements; and
   wherein the guiding post of the insulator is located between an adjacent through hole and an adjacent latch in a lengthwise direction of the insulator.

2. The electrical connector as claimed in claim 1, wherein the fastening element comprises a screw.

3. The electrical connector as claimed in claim 1, further comprising a metallic cover moveably attached to the insulative housing.

4. A reinforcing device for mounting to a printed circuit board having through holes thereof, comprising:
   an insulator defining opposite first and second surfaces and at least one pair of guiding posts protruding from the first and the second surfaces, respectively, said insulator defining at least one through hole adjacent to the at least one pair of posts;
   a metallic back panel attached to the first surface of the insulator, said metallic back panel defining a through hole and a guiding hole, the guiding hole receiving a corresponding guiding post to align the through holes of the metallic back panel and the insulator; and a fastening element inserted into the through holes of the insulator and the metallic back panel, and mechanically interconnecting the insulator and the metallic back panel on the printed circuit board;
   wherein the insulator forms a plurality of latches around edges thereof and defines a receiving space therebetween to receive and grasp the metallic back panel and to be sandwiched between the printed circuit board and the metallic back panel;
   wherein the metallic back panel defines an elongated protrusion along an edge thereof and wherein the insulator defines an opening between the two latches along the edge for receiving the elongated protrusion of the metallic back panel.

5. An electrical connector assembly comprising:
   a printed circuit board defining opposite first and second surfaces thereon and having through holes thereof;
   an electronic connector mounted upon the first surface;
   an insulator seated upon the second surface; and a metallic back panel seated upon the insulator and cooperating with the printed circuit board to sandwich said insulator therebetween in a vertical direction;

wherein said printed circuit board defines a first through hole, said metallic back panel defines a second through hole in alignment with said first through hole in said vertical direction, and said insulator defines a pair of guide posts unitarily extending respectively from opposite upper and lower faces thereof and into said first through hole and said second through hole;

wherein the insulator forms a plurality of latches around a periphery thereof to securely grip the metallic back panel and to be sandwiched between the printed circuit board and the metallic back panel;

wherein the insulator and the metallic back panel define a plurality of through holes for insertion of the fastening elements; and wherein the guiding post of the insulator is located between an adjacent through hole and an adjacent latch in a lengthwise direction of the insulator.

6. The electrical connector assembly as claimed in claim 5, wherein mutual attachment occurs between the insulator and said back panel.

* * * * *